United States Patent [19]
Douglas

[11] Patent Number: 5,196,785
[45] Date of Patent: Mar. 23, 1993

[54] TAPE AUTOMATED BONDING TEST APPARATUS FOR THERMAL, MECHANICAL AND ELECTRICAL COUPLING

[75] Inventor: Kevin Douglas, San Mateo, Calif.

[73] Assignee: Hewlett-Packard Company, Palo Alto, Calif.

[21] Appl. No.: 629,283

[22] Filed: Dec. 12, 1990

[51] Int. Cl.⁵ .................... G01R 31/02; G01R 31/28
[52] U.S. Cl. ............................ 324/158 F; 324/158 P
[58] Field of Search ............ 324/158 F, 158 P, 158 R; 439/68, 69, 70, 71, 72, 73; 165/80.2, 80.3

[56] References Cited

U.S. PATENT DOCUMENTS

| | | | |
|---|---|---|---|
| 4,839,587 | 6/1989 | Flatley et al. | 324/158 F |
| 4,956,605 | 9/1990 | Bickford et al. | 324/158 F |
| 4,962,356 | 10/1990 | Eberlein et al. | 324/158 F |
| 4,969,828 | 11/1990 | Bright et al. | 439/68 |
| 5,008,614 | 4/1991 | Shreeve et al. | 324/158 F |

*Primary Examiner*—Vinh Nguyen

[57] ABSTRACT

A test apparatus for a tape automated bonded component. The test apparatus includes a horizontally positioned printed circuit board having a plurality of conductive traces on an upper surface in an array corresponding to the leads of a tape automated bonding frame. The printed circuit board includes a central opening for entrance of a metallic heat transfer member. The tape automated bonding frame is aligned such that the component rests atop the heat transfer member and the leads of the frame are precisely positioned atop the conductive traces of the contact board. A reciprocating member is disposed above the frame for providing mechanical, electrical and thermal coupling of the frame to the test apparatus. A first elastomeric member is brought to bear on the backside of the component by cam action to thermally couple the component to the heat transfer member for purposes of burn-in testing and of channeling heat away from the component during testing other than burn-in. After thermal coupling has been achieved, a second elastomeric member provides a predetermined contact force to the leads of the frame at the region in which the leads are atop the conductive traces of the contact board, thereby providing the mechanical and electrical coupling. Input/output signals are channeled from a test performance board to the contact board via contact pins.

16 Claims, 3 Drawing Sheets

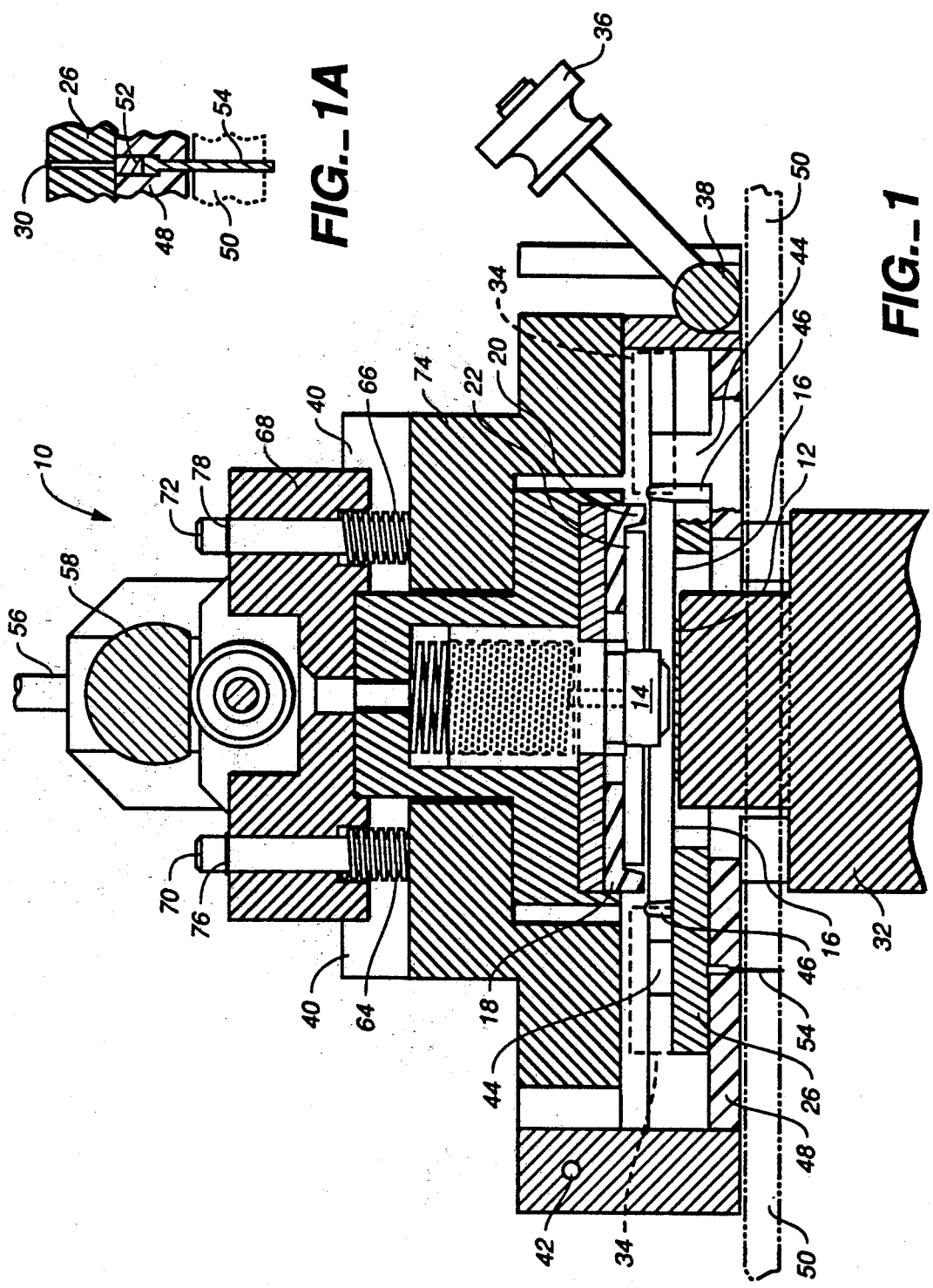

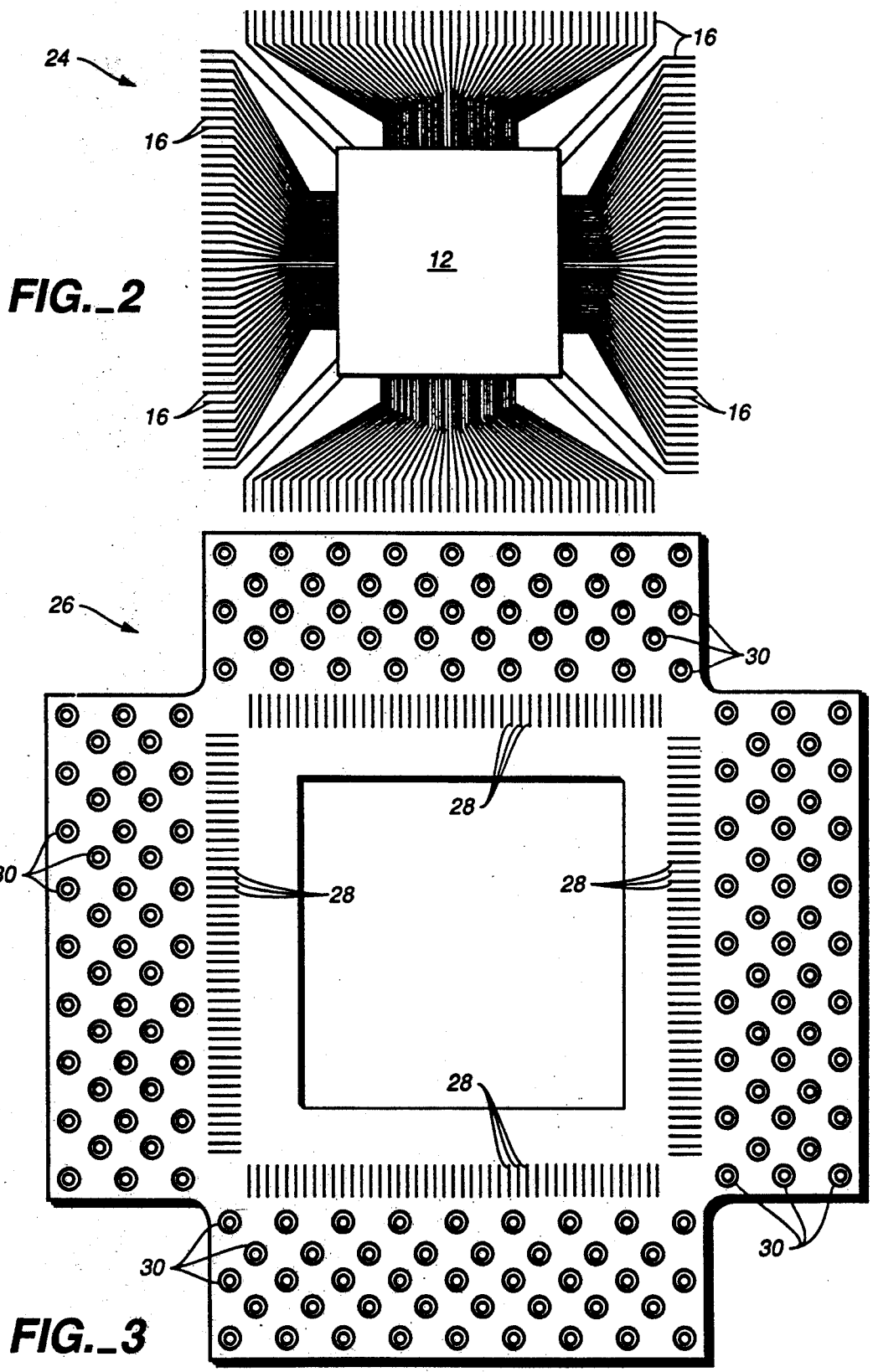
FIG._2
FIG._3

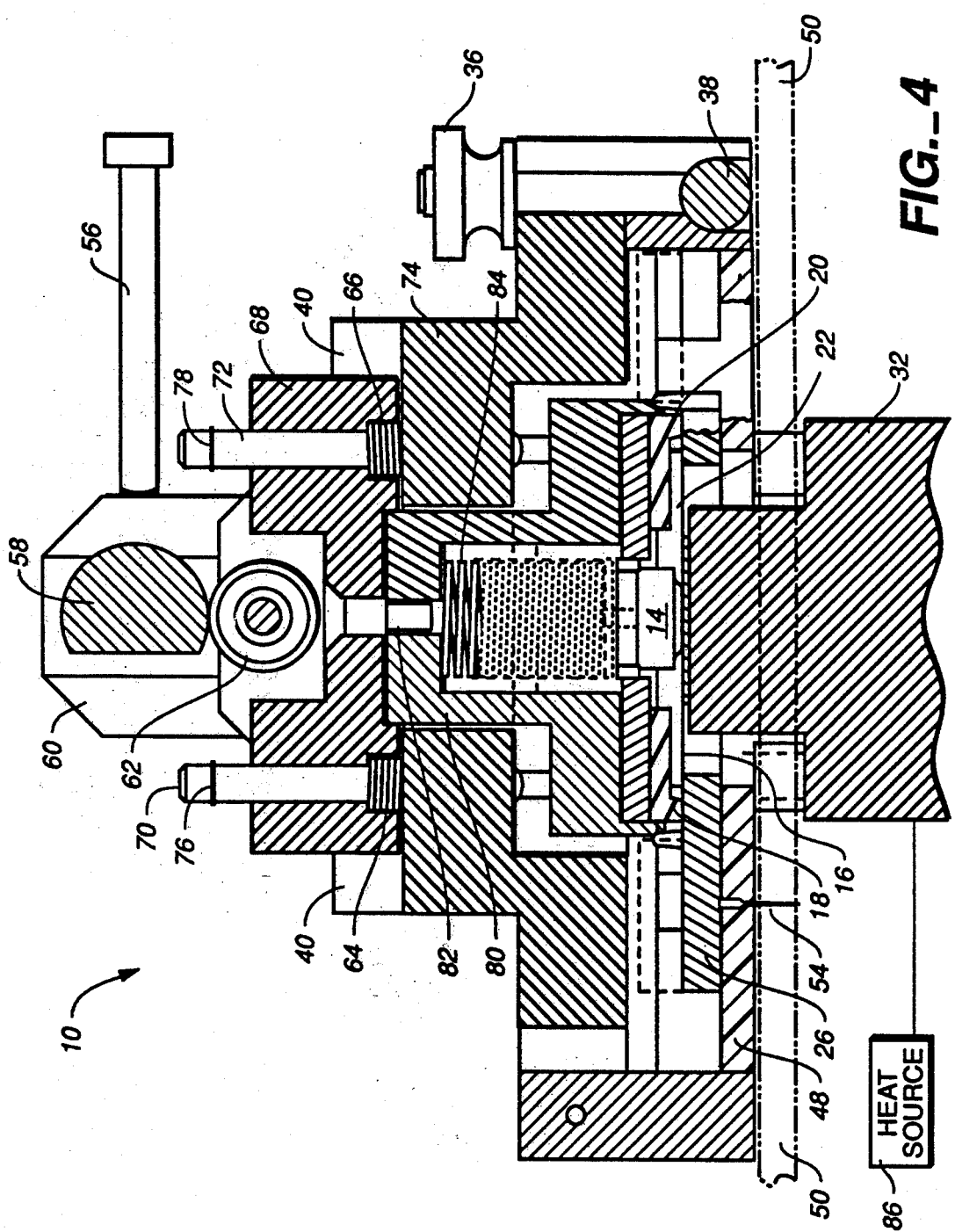

TAPE AUTOMATED BONDING TEST APPARATUS FOR THERMAL, MECHANICAL AND ELECTRICAL COUPLING

TECHNICAL FIELD

The present invention relates generally to pretesting of electronic components and particularly to apparatus for testing of components bonded to a tape automated bonding frame.

BACKGROUND ART

The increasing complexity and density of circuitry on a printed circuit board and of components on the printed circuit board increases the difficulty of diagnosing, servicing and repairing improperly functioning printed circuit boards. Even with stringent quality control measures, circuit components have a certain probability of failure. Pretesting components increases product yield, but various circuit components are difficult to test prior to electrical connection to a printed circuit board. For example, an individual integrated circuit chip may have hundreds of closely spaced contact pads, rendering pretesting an arduous task.

One interconnection technique which permits pretesting of chips is referred to as "tape automated bonding." This fabrication procedure utilizes a continuous insulated tape which is similar to photographic film to provide a planar substrate for chips that are attached to individual sections, or frames, of the tape. A spider-like metal pattern of conductive traces is etched on each frame. The traces may either "fan out", i.e., radiate from the center of the frame to the four edges, or may consist of four sets of parallel lines, with each set extending perpendicularly from one edge of the chip. The chip is carefully aligned with the center of the frame so that the contact pads of the chip are precisely located at corresponding conductive traces in the central portion of the frame. The chip is then attached to the tape automated bonding frame. This connection of the chip contact pads to the inner portion of the frame is referred to as "inner lead bonding."

After the inner lead bonding has been performed, the integrated circuit chip may be tested. U.S. Pat. No. 4,855,672 to Shreeve teaches a method for testing the reliability of integrated circuit chips bonded to tape automated bonding frames. Prior to splicing of the continuous insulated tape into the individual lead frames having integrated circuit chips, the chips are subjected to pre-burn-in testing. The continuous insulated tape is then placed on reels and mounted within an oven. The temperature in the oven is raised to approximately 150° C. and a dc bias voltage is applied to the reels to cycle each of the integrated circuit chips for a predetermined testing time. A post-burn-in test of the integrated circuit chips is then performed.

U.S. Pat. No. 4,696,526 to Newton et al. teaches that one difficulty with the reel-to-reel system of testing integrated circuit chips on a continuous insulated tape involves maintaining the burn-in temperature during testing. The Newton et al. patent teaches that high temperature testing requires that the temperature be maintained by plus or minus 1° C. during the test. To overcome this problem, the prior art patent teaches use of a carrier for a tape automated bonded semiconductor device. The carrier includes alignment posts which engage sprocket holes of an individual tape automated bonding frame. The carrier provides a handling medium for pretesting of the tape automated bonding semiconductor device. The Newton et al. device is to be used with existing test equipment in the semiconductor industry.

As described in Newton et al., the test equipment used in the semiconductor industry typically includes probes which are biased to provide a contact force on the individual leads of a tape automated bonding frame. The spring-actuated probes provide the inputting and outputting of signals to the many leads of the frame. However, testing often requires repeated insertion and removal of the frame into the test equipment. For example, there may be continuity, pre-burn-in, burn-in and final-performance tests on the same frame. Each insertion of the frame jeopardizes the leads of the frame as the spring-actuated probes are pressed against the leads. Moreover, the use of the probes provide a long electrical path which is detrimental to high speed performance. A third problem is that this requirement of individually contacting the leads of the frame with spring-actuated probes limits the minimum distance between adjacent frame leads.

Some of the difficulties encountered in the use of spring-actuated probes to electrically contact leads of a tape automated bonding frame are reduced by use of manufacturing the frame with test pads at an outer periphery. The probes can then make contact with the test pads, rather than final-contact regions of the frame leads. While this signicantly reduces the likelihood of the test equipment damaging a frame lead, over a period of time the scrubbing action caused by the sideways motion of the probes will wear the probes and affect the electrical contact with the test pads. Additionally, the manufacture of tape automated bonding frames to include the test pads increases the cost of manufacture and further increases the length of a signal path during testing.

It is an object of the present invention to provide a test apparatus which includes mechanical, electrical and thermal coupling of a tape automated bonding frame and its electronic component with a reduction in signal path lengths and with an interconnection scheme which does not jeopardize the structure of the tape automated bonding frame leads.

SUMMARY OF THE INVENTION

The above object has been met by a test apparatus which utilizes resilient compression force members to provide the mechanical, electrical and thermal coupling for the various tests that may be required for a tape automated bonded electronic component. A first elastomeric member is positioned slightly below the level of one or more other elastomeric members to sequentially cause contact of the electronic component to a heat transfer member and cause contact of the tape automated bonding frame leads to the traces of a printed circuit board.

The printed circuit board is mounted horizontally and is in electrical communication with a test board, so that the printed circuit board acts only as a channel for the inputting and outputting of signals from the test board to the tape automated bonding frame. The center of this printed circuit board has an opening into which the heat transfer member is mounted. The electronic component rests atop the heat transfer member.

An actuating mechanism is utilized to displace the first elastomeric member downwardly. The first elastomeric member is aligned with the heat transfer member, so that downward displacement provides a compression force on the electronic component resting on the heat transfer member. This ensures effective thermal coupling for channelling thermal energy to the electronic component during burn-in testing and for channelling thermal energy away from the electronic component during final-performance testing.

After contact of the first elastomeric member against the electronic component, the second elastomeric member is caused to press against the leads of the tape automated bonding frame by the actuating mechanism. The compression force on the frame leads provides the mechanical and electrical coupling of the frame leads to the conductive traces on the printed circuit board. Because the first and second elastomeric members move vertically, there is no scrubbing action during the coupling of the frame to the test apparatus. Rather, the tape automated bonding frame is merely compressed between resilient members and the surface to which the frame is to be connected.

An advantage of the present invention is that use of elastomeric members reduces the likelihood of damage to leads of the frame. Thus, manufacture of tape automated bonding frames having test pads extending beyond the contact areas of the frame becomes unnecessary. This allows the frame to be manufactured in a smaller size, thereby reducing the manufacturing cost. Since the length of the signal path is also reduced, the test apparatus does not include limitations on the testing of future performance improvements.

Another advantage of the present invention is that the interconnection system does not place limits on the pitch of the frames. The conductive traces on the printed circuit board may be manufactured to have the same spacing between adjacent conductive members. Spring-actuated probes of prior art test devices often limited the pitch of the tape automated bonding frame. Another advantage is that the printed circuit board can easily be replaced if the board is worn or damaged.

BRIEF DESCRIPTION OF THE DRAWINGS

FIG. 1 is a side sectional view of a test apparatus for tape automated bonded electronic components in accord with the present invention.

FIG. 1A is a side sectional view of the interconnection between a contact board and a test board of FIG. 1.

FIG. 2 is a top view of the tape automated bonded electronic component of FIG. 1.

FIG. 3 is a top of the contact board of FIG. 1.

FIG. 4 is a side sectional view of the test apparatus of FIG. 1 shown in an operational position.

BEST MODE FOR CARRYING OUT THE INVENTION

With reference to FIG. 1, a test apparatus 10 for tape automated bonded devices, such as an integrated circuit chip 12, is shown in a raised release position. In this position, an elastomeric pressure pad 14 is spaced apart from the integrated circuit chip 12 and a square array of downwardly depending elastomeric members are spaced apart from leads 16 of the tape automated bonding frame. Only three of the elastomeric members 18, 20 and 22 in the square array of elastomeric members are shown. Alternatively, the downwardly depending elastomer may have a unitary construction.

The tape automated bonding frame 24 is shown in FIG. 2. The frame 24 includes conductive leads 16 which attach at inner ends to the integrated circuit chip 12. The conductive leads 16 are typically made of copper and fan out to outer lead ends to provide a greater spacing between adjacent conductive leads for attachment to a contact printed circuit board 26 shown in FIG. 3. The total number of conductive leads is dependent upon the number of input/output pads of the integrated circuit chip 12. It is possible to limit the spacing, or pitch, between adjacent conductive leads to a distance of 4 mils. Such fine pitch tape automated bonding allows relative ease of attachment to hundreds of input/output pads on the integrated circuit chip.

The array of leads 16 on the tape automated bonding frame 24 corresponds at their ends to an array of conductive traces 28 on the contact printed circuit board 26. The conductive traces on the contact board 26 are in electrical communication with throughholes, or vias 30, on the contact board 26. This electrical communication may be provided by conductive paths in a layer or on a surface other than the top surface shown in FIG. 3. Alternatively, the conductive traces may be extended along the top surface to directly connect with the vias 30.

The vias 30 of the contact board 26 extend from the upper surface of the contact board to the lower surface. Typically, the tape automated bonding frame 24 is formed by photolithographically etching solid copper to obtain the desired pattern of leads 26. Thus, rather than terminating the leads 16 at positions corresponding to conductive traces 28 on the contact board 26, it is possible to etch the copper so that the leads 16 extend to the electrically associated vias 30. This is typically referred to as area array tape automated bonding.

Again referring to FIG. 1, the integrated circuit chip 12 is positioned to rest atop a metallic heat transfer member 32. The leads 16 of the tape automated bonding frame extend onto the contact board 26. The alignment of the frame 16 with the contact board 26 must be precise. For this reason, the frame is mounted to a carrier 34, shown in phantom, prior to insertion into the test apparatus 10. The test apparatus includes a latch 36 which is shown in an unlocked condition in FIG. 1. The latch pivots at shaft 38 to a vertical position, thereby locking a lid 40 of the test apparatus. However, in the position of FIG. 1 the lid 40 is able to pivot at a pin 42 at a side of the test apparatus opposite to the latch 36. Pivoting of the lid 40 carries the elastomeric pressure pad 14 and the elastomeric members 18, 20 and 22 away from the integrated circuit chip 12 and its tape automated bonding frame. The carrier 34 can then be removed and replaced with another tape automated bonded integrated circuit chip to be tested.

The test apparatus 10 includes three semicircular guide members 44 which act as keys for positioning the carrier 34. Only two guide members are shown in FIG. 1. A plurality of pins 46 extend upwardly from the base 48 of the test apparatus to further align the tape automated bonding frame. The alignment pins 46 extend into the sprocket holes of the tape automated bonding frame. The sprocket holes are not illustrated in FIG. 2, but are merely holes in an insulative tape which supports the copper leads 16 of the tape automated bonding frame 24.

Referring now to FIGS. 1 and 1A, the vias 30 of the contact board 26 are in electrical communication with a test printed circuit board 50. The test board 50 includes circuitry, not shown, which channels input and output signals to and from the integrated circuit chip 12 by way of the contact board 26 and the leads 16 of the tape automated bonding frame. The vias 30 of the contact board 26 each connect to a slightly compressible conductive member 52. The conductive member, for example, can be made of beryllium copper with a gold plating. The characteristics of conductive member ensure effective electrical contact between the via 30 and a contact pin 54. The plurality of contact pins 54 extends into vias of the test board 50 to allow the electrical communication between the test board and the contact board 26.

The test board 50 and the contact board 26 may be fastened to the test apparatus 10 in a manner which allows easy removal of the boards. Thus, the test apparatus 10 may be employed to test any variety of tape automated bonding frames. A user merely replaces one set of boards with a second set of boards having conductive regions which match the array of leads of the tape automated bonding frame to be tested. Each of the contact board 26 and the test board 50 includes a center opening to receive the heat transfer member 32, so that the transfer member makes thermal contact with the integrated circuit chip under test.

The test apparatus 10 is shown in a lowered, operational position in FIG. 4. A lever 56 is pivoted from an upright to a horizontal condition, causing rotation of a cam 58 within a housing 60. The diminished dimension of the cam 58 rotates from contact with a circular member 62. Because the arcuate portion of the periphery of the cam 58 is spaced apart from the center of the cam by a greater distance than the linear portion of the periphery, rotation of the cam urges the circular member 62 downwardly. This force overcomes the bias of coiled springs 64 and 66 which urge a block 68 of the test apparatus into the raised release position of FIG. 1. The coiled springs 64 and 66 are entrained about rods 70 and 72 that extend through the reciprocating block 68. The rods are fixed to a stationary portion 64 of the test apparatus. Upward movement of the reciprocating block 68 relative to the rods 70 and 72 is limited by C-clips 76 and 78 which are mounted on the rods.

As stated above, rotation of the lever 56 presses the reciprocating block 68 downwardly. The reciprocating block is fixed to a center plunger mechanism 80 by a screw 82. Thus, the center plunger mechanism moves with the reciprocating block. A coiled spring 84 is housed within the center plunger mechanism 80.

As the test apparatus 10 moves to the operation position shown in FIG. 4, it is the elastomeric pressure pad 14 which first provides effective coupling of the tape automated bonded integrated circuit chip 12 with the test apparatus. The elastomeric pressure pad originates at a level below that of the other elastomeric members 18, 20 and 22. The elastomeric pressure pad 14 provides a compression force onto the heat transfer member 32. The heat transfer member 32 is linked to a source of heat 86. The source may provide thermal energy to the heat transfer member, which in turn raises the temperature of the integrated circuit chip 12. Consequently, the test apparatus 10 may be used for burn-in testing as well as other testing. For tests other than the burn-in test, the heat transfer member acts as a heat sink to prevent an undesired increase in temperature of the integrated circuit chip 12.

After accomplishment of an effective coupling of the integrated circuit chip 12 to the test apparatus 10, a temporary mechanical and electrical connection must be accomplished. In the prior art, spring-actuated probes were used to contact individual leads of the tape automated bonding frame. One difficulty with this method of making contact was that the spring-actuated probes would bend the leads, thereby jeopardizing the structural integrity of the leads. The test apparatus 10 of the present invention, however, utilizes the elastomeric members 18, 20 and 22 to ensure effective mechanical and electrical contact between the leads 16 of the tape automated bonding frame and the conductive traces of the contact board 26. The center plunger mechanism 80 continues to descend after contact of the pressure pad 14 with the integrated circuit chip 12. The square array of elastomeric members 18, 20 and 22 is brought to press against those regions of the leads 16 which are aligned with the conductive traces of the contact board 26. The alignment of the leads 16 and the conductive traces 28 may be best seen by comparison of FIGS. 2 and 3. However, the particular alignment is not critical to the present invention.

In operation, the latch 36 is moved to the release position shown in FIG. 1 to allow the lid 40 of the test apparatus 10 to be pivoted into a position in which a carrier 34 may be inserted as shown. Alignment of the carrier 34 positions leads 16 of a tape automated bonding frame with respect to conductive traces on the contact board 26. The lid 40 is then closed and the latch 36 is moved to the position shown in FIG. 4.

Pivoting of the lever 56 rotates the cam 58 to press the reciprocating block 68 and the center plunger mechanism 80 downwardly. The elastomeric pressure pad 14 provides a compression force to the backside of the tape automated bonded integrated circuit chip 12 for effective thermal coupling to the heat transfer member 32. After thermal coupling has been achieved, the square array of elastomeric members 18, 20 and 22 provides the mechanical and electrical connection of the leads 16 of the frame to the conductive traces 28 of the contact board 26. A predetermined contact force is applied by the compression. The present invention significantly reduces the risk of damage to the leads 16 of the tape automated bonding frame.

The electrical path from the leads 16 and the conductive traces of the contact board 26 continue through the vias 30 to the compressible conductive members 52 and the contact pins 54 shown in FIG. 1A. The conductive pins 54 extend into throughholes of the test performance board 50. The input and output signals necessary for testing of the integrated circuit chip 12 may then be channeled from the test performance board via the contact board 26 and the leads 16 of the tape automated bonding frame.

I claim:

1. A test apparatus for an assembly of an electronic component in a tape automated bonding frame having inner lead ends bonded to said electronic component comprising,
    a heat transfer member positioned to contact an electronic component bonded to a tape automated bonding frame, said heat transfer member having a high thermal conductivity,
    contact means having a fixed array of electrically conductive planar signal traces corresponding positionally to leads on said tape automated bonding frame for inputting and outputting signals to said electronic component, said contact means being a first printed circuit board having said planar signal traces on a first surface thereof, and elastomeric means for selectively capturing said leads of said tape automated bonding frame against said planar signal traces and for resiliently exerting a compression force on said leads to maintain said leads in a parallel relationship with said planar signal traces.

2. The test apparatus of claim 1 further comprising a second printed circuit board, said first printed circuit board being in electrical communication with said second printed circuit board such that inputting and outputting of signals to said electronic component is from said second printed circuit board via said first printed circuit board.

3. The test apparatus of claim 2 further comprising a plurality of conductive pins having first and second ends, said first printed circuit board being electrically connected to said second printed circuit board by said plurality of conductive contact pins, said first printed circuit board being at said first ends and said second printed circuit board being at said second ends of said plurality of conductive contact pins.

4. The test apparatus of claim 1 wherein said heat transfer member is a fixed metallic member having a planar surface generally parallel to said first surface of said first printed circuit board.

5. The test apparatus of claim 1 wherein said heat transfer member is in thermal energy transfer relation with a heat source.

6. The test apparatus of claim 1 wherein said elastomeric means includes a plurality of resilient members disposed at said planar signal traces to capture said leads of said tape automated bonding frame therebetween.

7. The test apparatus of claim 1 further comprising an elastomeric pressure pad disposed to selectively compress said electronic component against said heat transfer member.

8. A test apparatus comprising,
alignment means for positionally fixing a tape automated bonding frame having an electronic component bonded thereto,
a metallic member disposed to be in thermal transfer engagement with said electronic component when positioned by said alignment means,
a horizontally disposed first printed circuit board having an upper surface having an array of conductive traces in contact with leads of said tape automated bonding frame positioned by said alignment means, said conductive traces and said leads being generally parallel,
an elastomeric member disposed on a side of said leads opposite to said array of conductive traces, and
reciprocating means for selectively pressing said elastomeric member onto said leads to provide mechanical and electrical contact of said leads to said conductive traces.

9. The test apparatus of claim 8 wherein said reciprocating means is an actuating mechanism having a compressing position and a retracted position, said elastomeric member being spaced apart from said leads when said actuating mechanism is in said retracted position.

10. The test apparatus of claim 9 further comprising an elastomeric pressure pad mounted to said actuating means for corresponding displacement with said elastomeric member upon initiation of movement of said actuating mechanism from said retracted position toward said compressing position, said elastomeric pressure pad being disposed to compress said electronic component against said metallic member when said actuating mechanism is in said compressing position.

11. The test apparatus of claim 8 further comprising a second printed circuit board electrically connected to said first printed circuit board, said second printed circuit board being a test performance board.

12. The test apparatus of claim 8 wherein said metallic member is in thermal communication with a source of heat.

13. A test apparatus comprising,
a horizontally positioned printed circuit board having a plurality of horizontal conductive circuit traces on an upper surface, said printed circuit board having an opening therein,
a metallic member within the opening of said printed circuit board,
a tape automated bonding frame having inner lead ends bonded to an electronic component, said frame having outer leads positioned atop said conductive circuit traces, said outer leads being generally parallel to said conductive circuit traces, and
a reciprocating means disposed above said frame for providing mechanical, electrical and thermal coupling of said frame, said reciprocating means having a first elastomeric member aligned with said metallic member to exert a compression force on said electronic component for transfer of thermal energy therebetween, said reciprocating means having a second elastomeric member aligned with said conductive circuit traces of said printed circuit board to exert a compression force on outer leads of said frame, thereby providing mechanical and electrical contact of said outer leads to said conductive members.

14. The test apparatus of claim 13 further comprising a test performance printed circuit board in electrical communication with said horizontally positioned printed circuit board.

15. The test apparatus of claim 13 wherein said reciprocating means is an actuation mechanism having a raised release position and a lowered compression position.

16. The test apparatus of claim 13 further comprising vertical alignment posts coupled to said frame.

* * * * *